United States Patent
Yee

(10) Patent No.: US 7,371,602 B2
(45) Date of Patent: May 13, 2008

(54) SEMICONDUCTOR PACKAGE STRUCTURE AND METHOD FOR MANUFACTURING THE SAME

(75) Inventor: Kuo Chung Yee, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 41 days.

(21) Appl. No.: 11/294,599

(22) Filed: Dec. 6, 2005

(65) Prior Publication Data

US 2006/0197217 A1 Sep. 7, 2006

(30) Foreign Application Priority Data

Mar. 2, 2005 (TW) .............................. 94106297 A

(51) Int. Cl.
| | |
|---|---|
| H01L 21/00 | (2006.01) |
| H01L 21/44 | (2006.01) |
| H01L 21/768 | (2006.01) |
| H01L 31/0203 | (2006.01) |
| H01L 29/40 | (2006.01) |
| H01L 23/52 | (2006.01) |
| H01L 23/48 | (2006.01) |

(52) U.S. Cl. ............................. 438/64; 438/48; 438/26; 438/22; 438/667; 438/668; 257/433; 257/434; 257/E21.597; 257/621; 257/774

(58) Field of Classification Search .................. 438/64, 438/48, 26, 22, 667, 668; 257/433, 434, 257/621, 774, E21.597
See application file for complete search history.

(56) References Cited

U.S. PATENT DOCUMENTS

| 7,221,051 B2 * | 5/2007 | Ono et al. ................... 257/704 |
| 2002/0019069 A1 * | 2/2002 | Wada ........................... 438/69 |
| 2003/0113979 A1 * | 6/2003 | Bieck et al. ................. 438/411 |

* cited by examiner

Primary Examiner—Luan Thai

(57) ABSTRACT

A semiconductor package structure comprises a chip, a plurality of pad extension traces, a plurality of via holes, a lid and a plurality of metal traces, wherein the chip has an optical component and a plurality of pads disposed on its active surface; pad extension traces are electrically connected to the pads; the via holes penetrate the chip and are electrically connected to the pad extension traces and exposed out of side surfaces of the semiconductor package structure; the lid is adhered onto the active surface of the chip; and the plurality of metal traces is disposed on the back surface of the chip, electrically connected to the plurality of via holes, and used to define a plurality of solder pads thereon. The present invention also provides a method for manufacturing the semiconductor package structure.

12 Claims, 8 Drawing Sheets

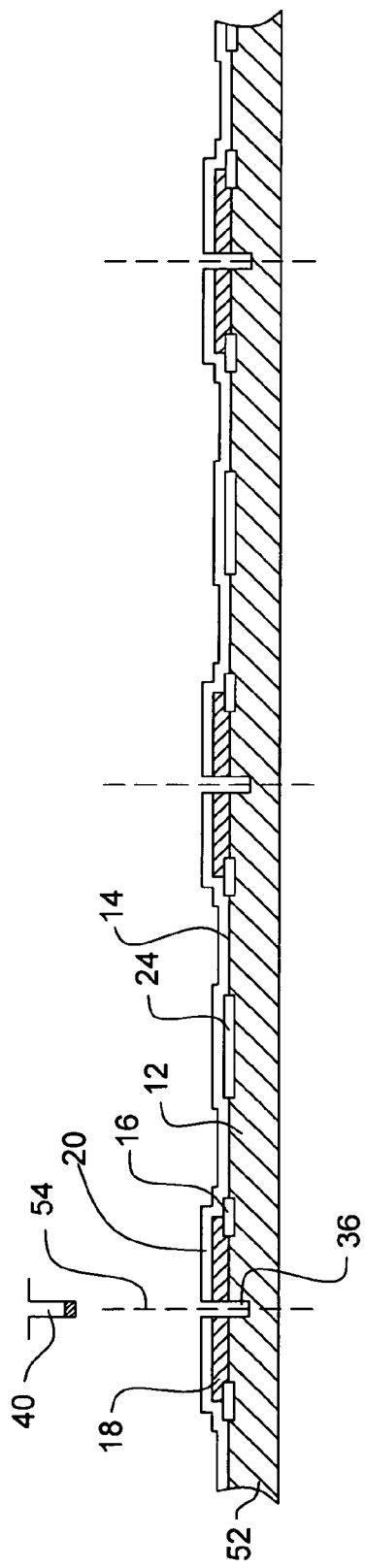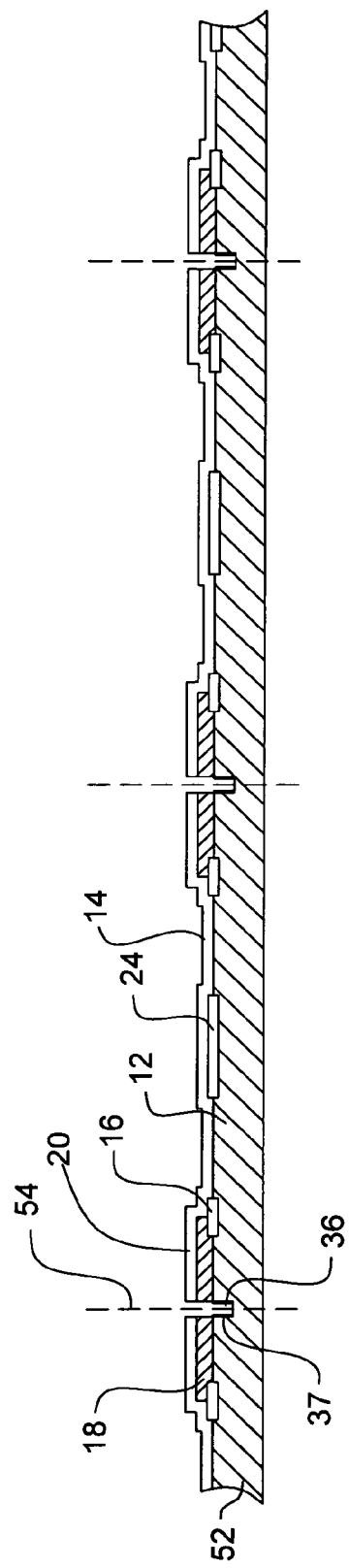

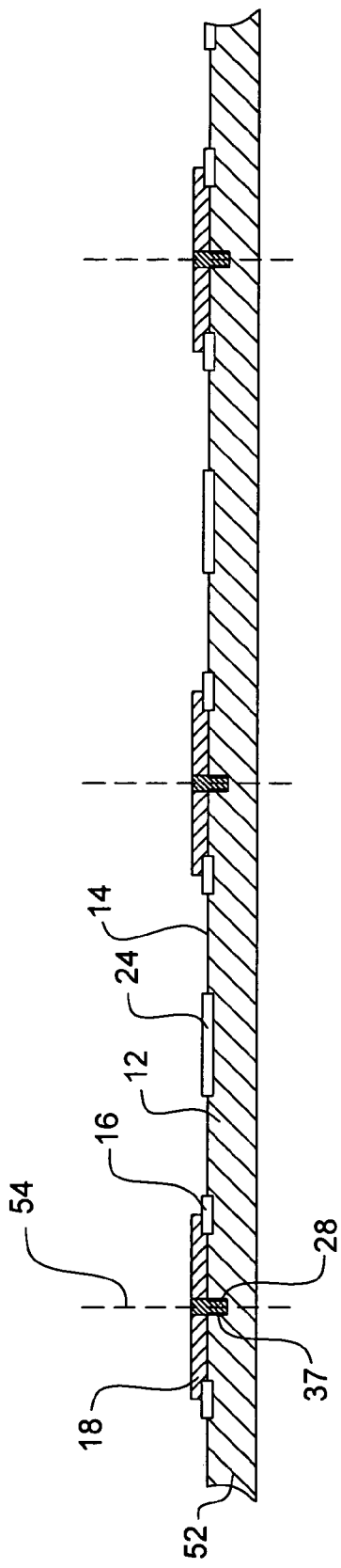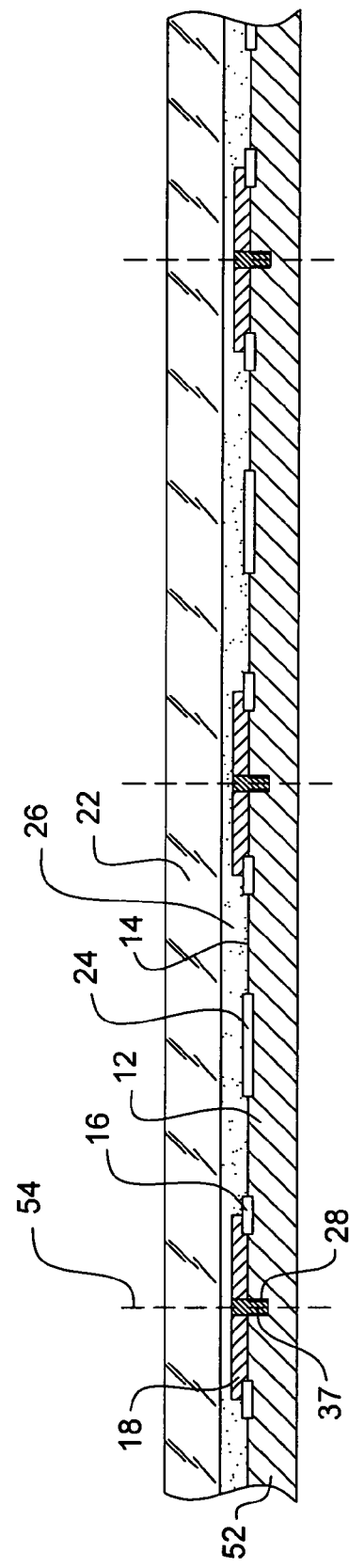

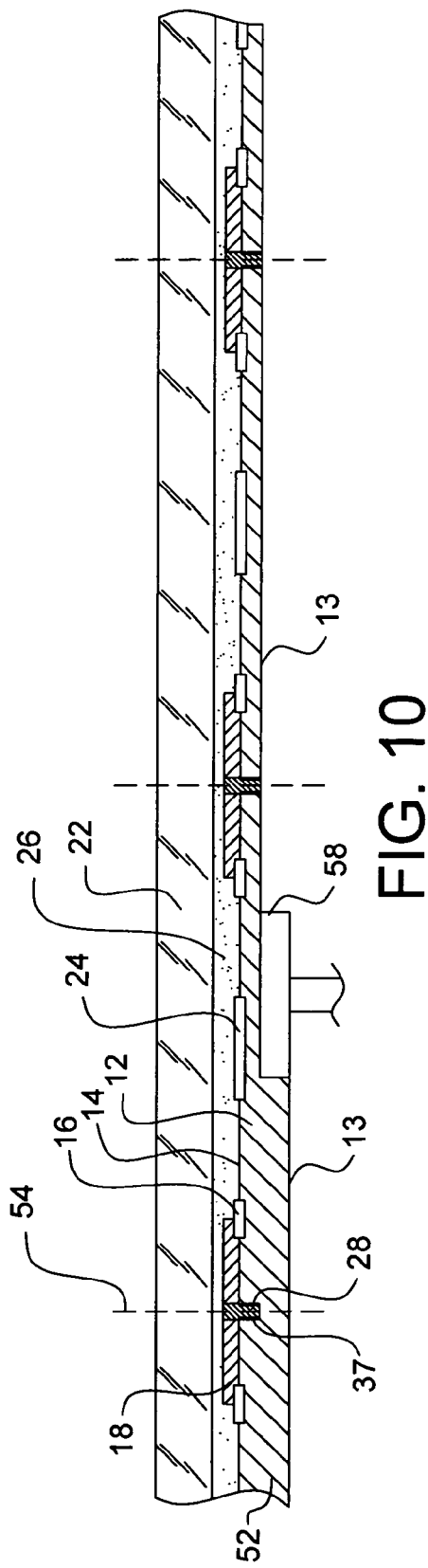
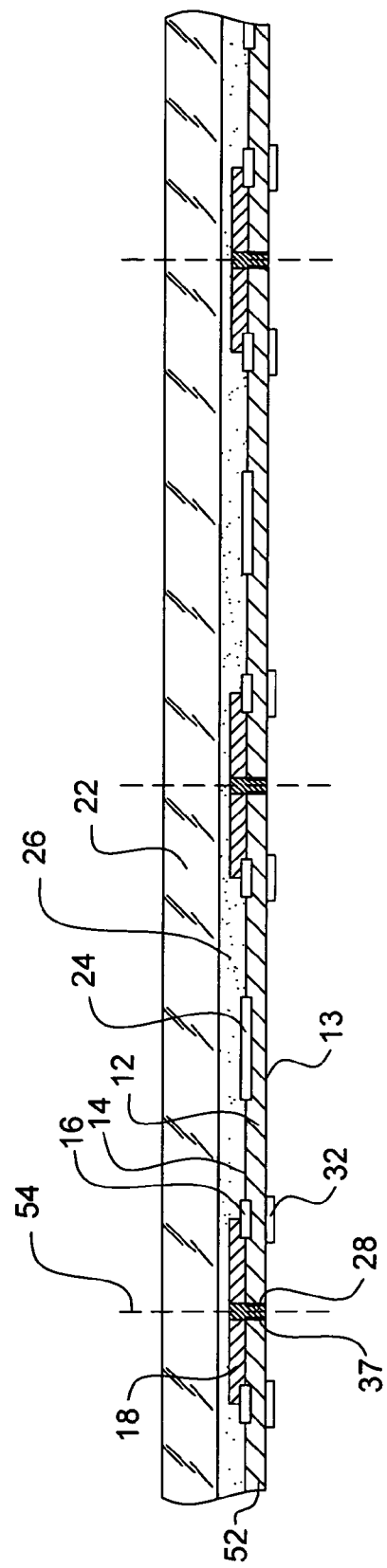

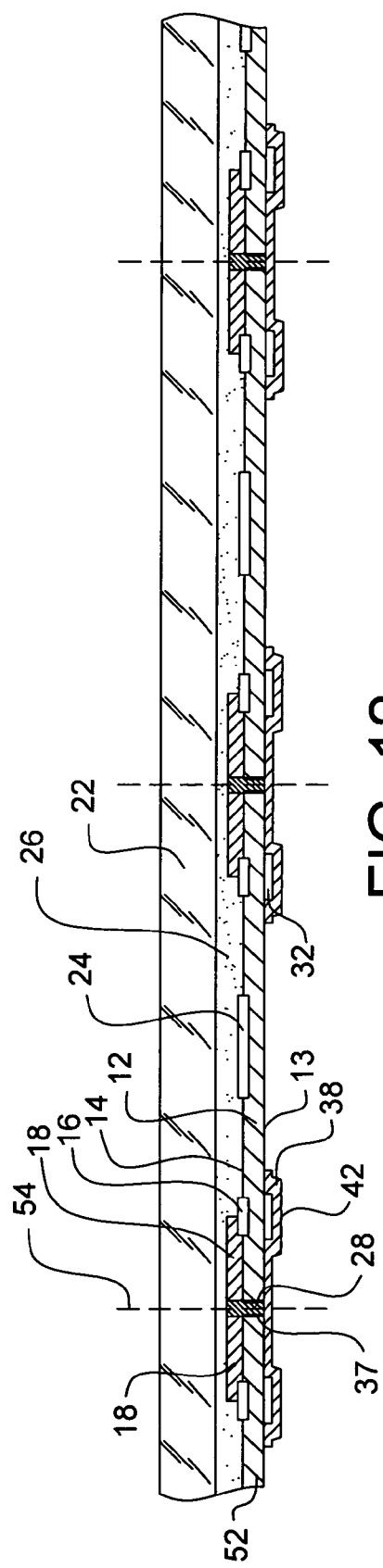
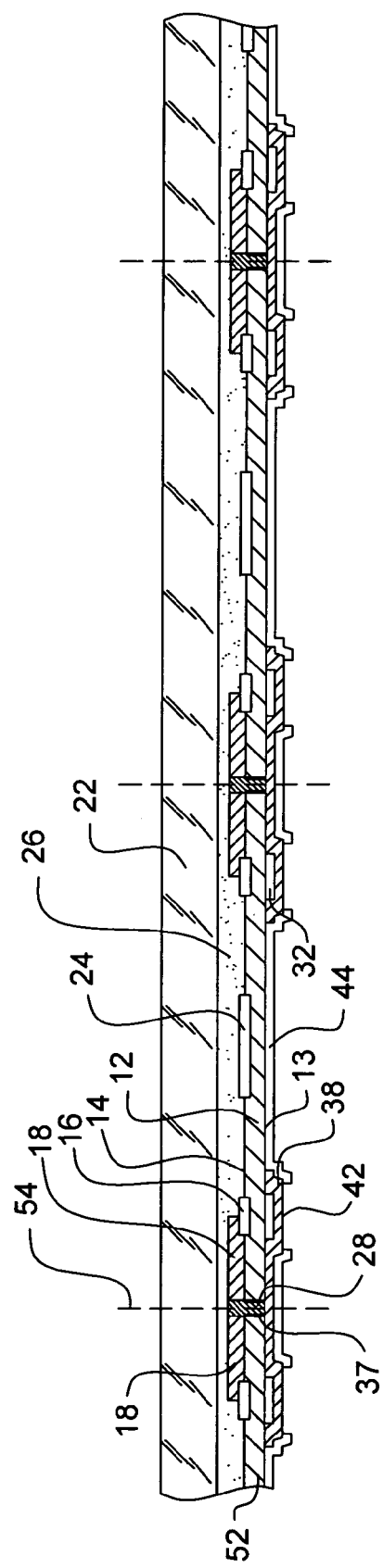

SEMICONDUCTOR PACKAGE STRUCTURE AND METHOD FOR MANUFACTURING THE SAME

CROSS REFERENCE TO RELATED APPLICATION

This application claims the priority benefit of Taiwan Patent Application Serial Number 094106297, filed on Mar. 2, 2005, the full disclosure of which is incorporated herein by reference.

BACKGROUND OF THE INVENTION

1. Field of the Invention

This invention generally relates to a semiconductor package structure and a method for manufacturing the same, and more particularly to a wafer level semiconductor package structure and a method for manufacturing the same.

2. Description of the Related Art

The semiconductor package mainly serves four functions, i.e. signal distribution, power distribution, heat dissipation and element protection. In general, a semiconductor chip is packaged into an enclosure, and then disposed on a printed circuit board, together with other components, such as capacitors, resistors, inductors, filters, switches, and optical and RF components.

The complementary metal-oxide semiconductor (CMOS) technology for making optical components is similar to that for making semiconductor chips. CMOS is typically formed from silicon (Si) and germanium (Ge) and generally includes N-type metal-oxide semiconductor (NMOS) transistors with negative charged carriers and P-type metal-oxide semiconductor (PMOS) transistors with positive charged carriers. Such NMOS and PMOS may generate currents after sensing light, and the currents may be then recorded and read as image.

Further, as the demands for lighter and more complex electronic devices gradually increase, the operating speed and the complexity of IC chips have become higher and higher. Accordingly, higher packaging efficiency is required. In the prior art, various semiconductor packages and manufacturing methods have been provided for improving the packaging efficiency and reliability. For example, U.S. Pat. No. 6,040,235 entitled "Methods And Apparatus For Producing Integrated Circuit Devices" issued to Badehi on May 21, 2000, and U.S. Pat. No. 6,117,707 entitled "Methods Of Producing Integrated Circuit Devices" issued to Badehi on Sep. 12, 2000 disclose methods for manufacturing the semiconductor package structures. However, these semiconductor package structures and the manufacturing methods in the prior art still have many limitations and drawbacks, and therefore can not entirely meet the requirements for the semiconductor package structures.

Accordingly, there is a need for providing a wafer level semiconductor package to further meet the requirement on the semiconductor package structure.

SUMMARY OF THE INVENTION

It is an object of the present invention to provide a semiconductor package structure and a method for manufacturing the same, which can offer higher packaging efficiency and eliminate many limitations and drawbacks in the prior art.

In order to achieve the object, the present invention provides a semiconductor package structure comprising a chip, a plurality of pad extension traces, a plurality of via holes, a lid and a plurality of metal traces, wherein the chip has an optical component and a plurality of pads disposed on its active surfaces; the pad extension traces are electrically connected to the pads; the via holes penetrate the chip and are electrically connected to the pad extension traces and exposed out of side surfaces of the semiconductor package structure; the lid is adhered onto the active surface of the chip; and the plurality of metal traces is disposed on the back surface of the chip, electrically connected to the plurality of via holes, and used to define a plurality of solder pads thereon.

The semiconductor package structure according to the present invention can be massively produced at the wafer level, thus reducing the cost for the package process and increasing the packaging reliability.

On the other hand, the present invention provides a method for manufacturing a semiconductor package structure, wherein the method comprises the following steps: providing a wafer, which defines an active surface and a back surface, and has a plurality of chips and a plurality of scribe lines positioned among the chips, wherein each chip has a plurality of bonding pads and an optical component disposed on the active surface thereof with the optical component being electrically connected to the chip; then forming a plurality of pad extension traces on the active surface of the wafer, to be electrically connected to the plurality of bonding pads, respectively; subsequently forming on the scribe lines of the wafer a plurality of holes that penetrate the plurality of pad extension traces; subsequently forming conducting material within the plurality of holes, so as to form a plurality of via holes electrically connected to the plurality of pad extension traces; then providing a lid to be adhered to the wafer and to cover the wafer; and forming on the back surface of the wafer a plurality of metal traces, which are electrically connected to the plurality of via holes and define a plurality of soldering pads; and finally, cutting the wafer so as to form the respective semiconductor package structures.

The semiconductor package structure and the method for manufacturing the same according to the present invention may prevent the bonding pads and the adjacent traces thereof from damage caused by the over-temperature generated during laser drilling and further prevent the chip from being disabled, owing to the fact that the via holes are formed on the scribe lines while being kept apart from the pads with an appropriate distance.

Other objects, features and advantages of the present invention as well as what have been set forth above will become more apparent from the following detailed description taking embodiments of the prevention in conjunction with the accompanying drawings.

BRIEF DESCRIPTION OF THE DRAWINGS

FIGS. 2-15 are views used to describe the manufacturing method of a semiconductor package structure according to one embodiment of the present invention.

DETAILED DESCRIPTION OF THE PREFERRED EMBODIMENT

Figure 1:
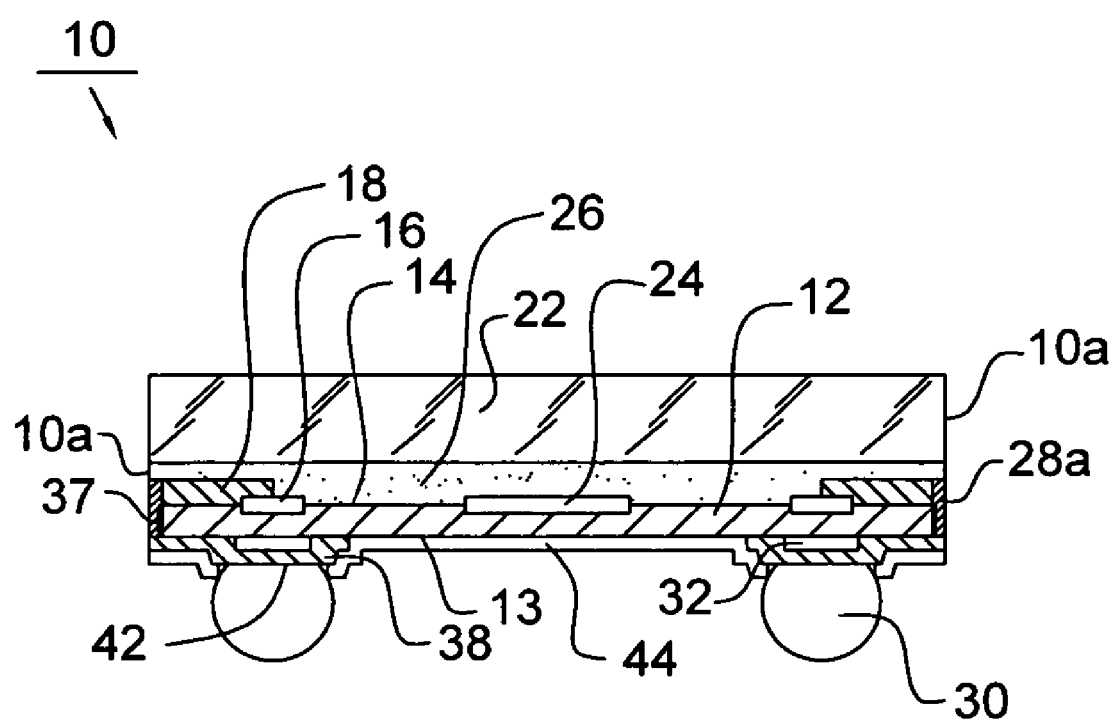
FIG. 1 shows a sectional view of a semiconductor package structure according to a first embodiment of the present invention.

Now refer to FIG. 1, which shows a sectional view of a semiconductor package structure 10 according to a first embodiment of the present invention. The semiconductor package structure 10 comprises a chip 12 having an active surface 14, a back surface 13 opposite to the active surface 14, an optical component 24 (e.g. a sensor or a photo coupler) disposed on the active surface 14 and electrically connected to the chip 12, and a plurality of bonding pads 16 disposed on the active surface 14. The optical component 24 can be formed from complementary metal-oxide semiconductor (CMOS).

The chip 12 further has a plurality of via holes 28a, penetrating the chip 12 and exposed out of the side surface 10a of the semiconductor package structure 10, and a plurality of pad extension traces 18 for electrically connecting the bonding pads 16 to the via holes 28a. The semiconductor package structure 10 further comprises a lid 22 being adhered onto the active surface 14 of the chip 12 by an adhesive layer 26, and covering the active surface 14 and the plurality of pad extension traces 18.

The semiconductor package structure 10 further comprises a plurality of compliant pads 32, a plurality of metal traces 38, a solder mask 44 and a plurality of solder balls 30. The compliant pads 32 are formed on the back surface 13 of the chip 12. The metal traces 38 are formed on the back surface 13 of the chip 12 and on the compliant pads 32. The solder mask 44 is coated on the back surface 13 of the chip 12 with parts of the metal traces 38 exposed therefrom, wherein the parts are defined as a plurality of solder pads 42. The solder balls 30 are fixed on the solder pads 42 for being connected to an external circuit, e.g. a printed circuit board. The compliant pads 32 may be formed substantially from a photosensitive benzocyclobutene polymer for reducing the internal stress or thermal stress of the semiconductor package structure 10. Further, the solder mask 44 may be formed substantially from the photosensitive benzocyclobutene polymer. The via holes 28 are electrically connected to the pad extension traces 18 and the metal traces 38, respectively, and have parts of their internal surface coated with an insulating layer 37.

Now refer to FIGS. 2-15, which are used to describe the manufacturing method of a semiconductor package structure 10 according to one embodiment of the present invention.

Figure 2:
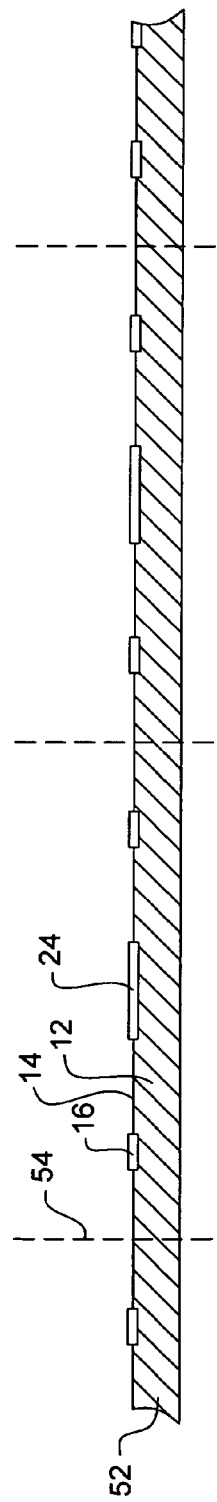
Figure 3:
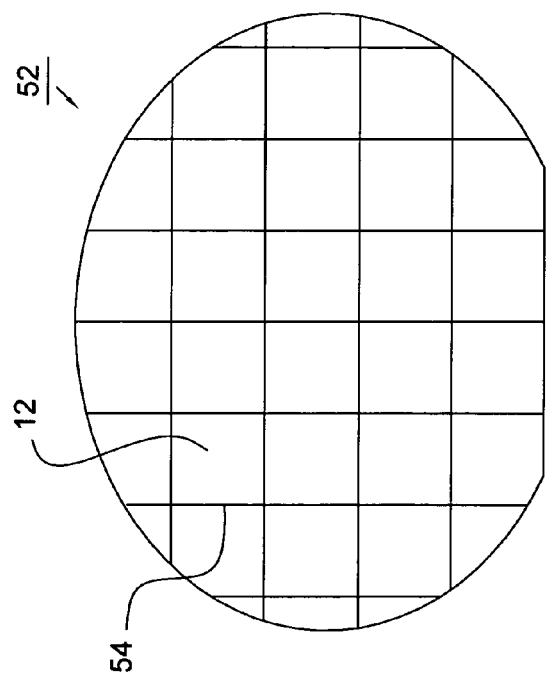

As shown in FIGS. 2 and 3, a wafer 52 includes a plurality of chips 12 on which a plurality of bonding pads 16 and an optical component 24 are located, wherein adjacent chips 12 are spaced with scribe lines 54. The optical component 24 is disposed on the active surface 14, for interacting with the incident light or emitting light.

Figure 4:
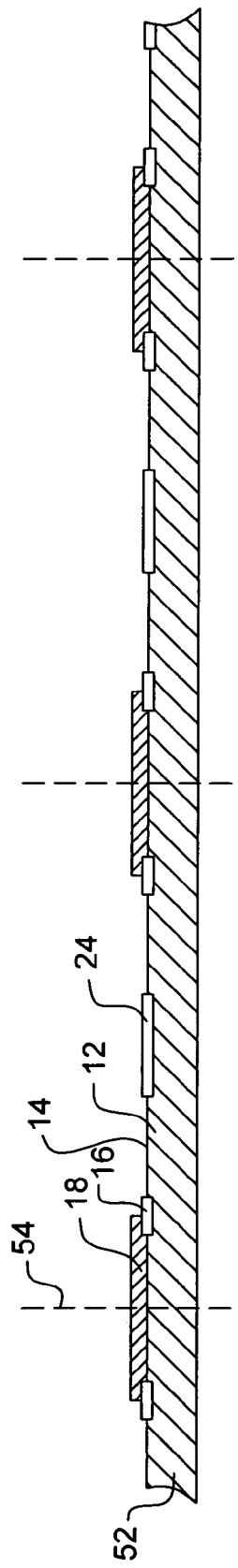

Referring to FIG. 4, a plurality of pad extension traces 18 that are electrically connected to the bonding pads 16 are formed on the wafer 52 by photolithography and etching processes for a redistribution layer (RDL).

Figure 5:
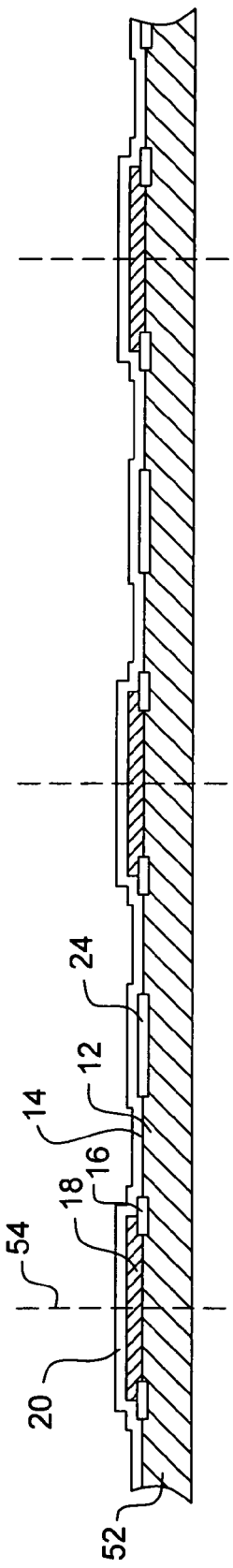

Referring to FIG. 5, a photoresist 20 can be optionally coated on the active surface 14 of the chip 12 so as to prevent contamination caused by drilling in a next process. It should be understood by those skilled in the art that the step of coating the photoresist 20 is optional and not absolutely necessary.

Referring to FIG. 6, a plurality of holes 36 is formed on the scribe lines 54 by using a laser drill 40, wherein the holes have a predetermined depth that penetrates the photoresist 20 and the pad extension traces 18.

Referring to FIG. 7, the photoresist 20 is striped off and an insulating layer 37 is then formed on the inner surface of each hole 36 with at least part of the pad extension trace 18 exposed therefrom.

Referring to FIG. 8, a conductive material such as copper (Cu) is deposited in the plurality of holes 36 by photomasking and sputtering processes so as to form a plurality of via holes 28 that are electrically connected to the pad extension traces 18. Alternatively, the conductive material may be plated only on the inner surface of each hole 36, i.e., on part of the side surface of the insulating layer 37 and the pad extension trace 18 within each hole 36, so as to form the via holes 28 that are electrically connected to the pad extension traces 18.

Referring to FIG. 9, a lid 22 is adhered to the wafer 52 by an adhesive layer 26 and covers the active surface 14 of the chip 12. The lid 22 may be made of transparent material such as glass, acrylic resin and sapphire, so that light can be transmitted through the lid 22 and can interact with the optical component 24 on the chip 12.

Referring to FIG. 10, the back surface 13 of the wafer 52 is ground by a mechanical grinding wheel 58 or by the chemical grinding process so as to reduce the thickness of the wafer 52 to a predetermined thickness and make the via holes 28 exposed out of the back surface 13 of the chip 12.

In one alternative embodiment of the present invention, the plurality of holes 36 may directly penetrate the chip 12 such that the subsequently formed via holes 28 are directly exposed out of the back surface 13. It could be understood by those skilled in the art that the wafer 52 may be formed to have a predetermined height without further grinding, or alternatively be ground to a predetermined thickness after forming the via holes 28.

Referring to FIG. 11, a plurality of compliant pads 32 is formed on the back surface 13 of the chip 12 by a thin-film deposition process and photolithography and etching processes. Generally, the compliant pads 32 may be made of photosensitive benzocyclobutene (BCB) polymer.

Referring to FIG. 12, a plurality of metal traces 38 is formed on the back surface 13 of the chip 12 and the plurality of compliant pads 32 by a thin-film deposition process and photolithography and etching processes, wherein the metal traces 38 are respectively connected to the via holes 28.

Referring to FIG. 13, a solder mask 44 is coated on the back surface 13 of the chip 12 so as to cover the metal traces 38 with parts of the metal traces 38 exposed therefrom, such that the parts can be defined as a plurality of solder pads 42 corresponding to the compliant pads 32. The solder mask 44 may be formed from photosensitive benzocyclobutene polymer.

Figure 14:
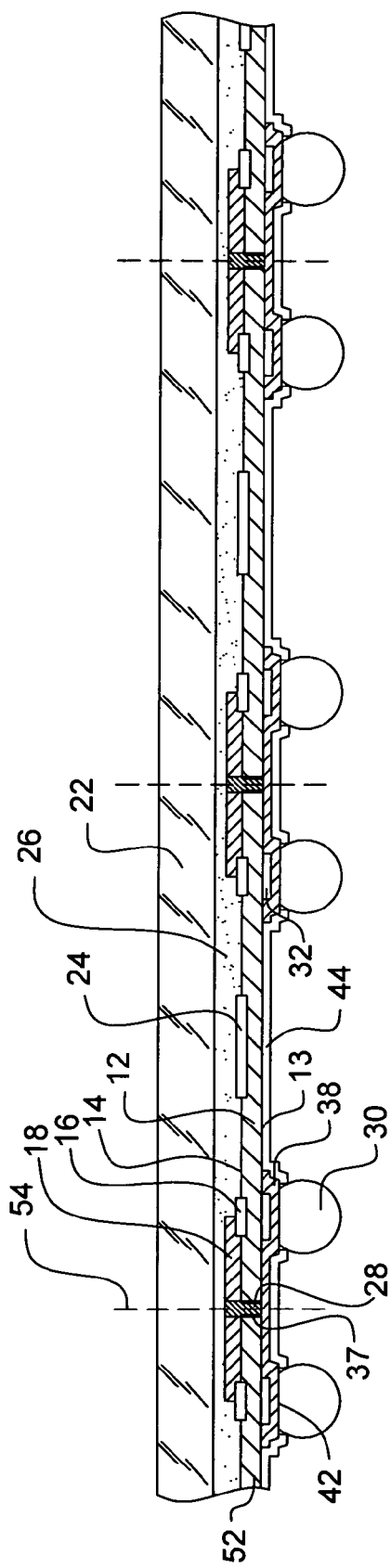

Referring to FIG. 14, a plurality of solder balls 30 is respectively disposed on the solder pads 42.

Figure 15:
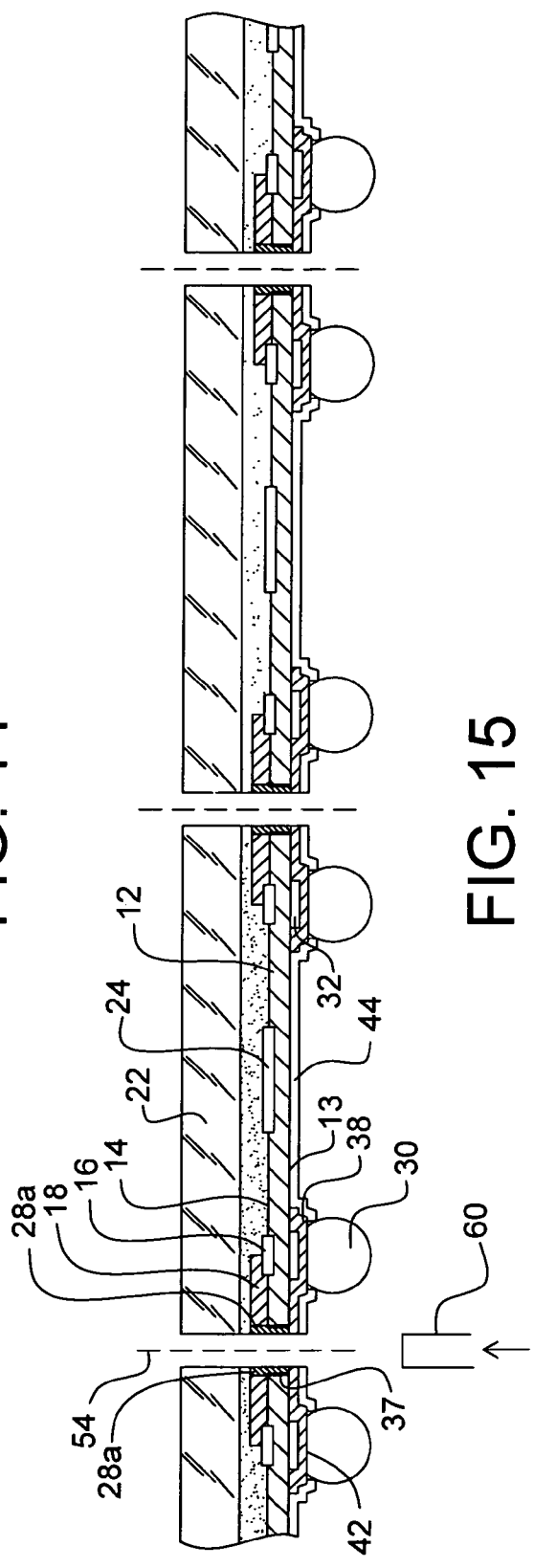

Referring to FIG. 15, a cutting blade 60 cuts the back surface 13 of the wafer 52 along predetermined paths, i.e., the scribe lines 54 of the wafer 52, for forming the semiconductor package structure 10, as shown in FIG. 1. In this step, each via hole 28 is cut into two parts 28a.

In the semiconductor package structure and the method for manufacturing the same according to the present invention, due to the fact that the via holes 28 are formed on the scribe lines 54 while being kept apart from the pads 16 with an appropriate distance, it may be achieved to prevent the bonding pads 16 and the adjacent traces thereof from damage caused by the over-temperature generated during laser drilling and further prevent the chip from being disabled.

On the other hand, the semiconductor package structure 10 is capable of being applied to the package of optical components and massively produced at the wafer level, thus reducing the cost for the package process and increasing the packaging reliability.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A method of manufacturing a semiconductor package structure, said method comprising:

providing a wafer that defines an active surface and a back surface opposite to the active surface and has a plurality of chips and a plurality of scribe lines formed between adjacent ones of the chips, wherein each said chip has a plurality of bonding pads and an optical component disposed on the active surface, with the optical component being electrically connected to the chip;

forming a plurality of holes on the active surface of the wafer, wherein each of the holes extends across one of the scribe lines between an adjacent pair of the chips;

forming a conductive material within the holes to form a plurality of via holes electrically connected to the pad extension traces, respectively;

attaching a lid to the active surface of the wafer;

forming a plurality of metal traces on the back surface of the wafer, wherein the metal traces are electrically connected to the via holes and define a plurality of solder pads thereon, respectively; and cutting the wafer along the scribe lines to form individual semiconductor package structures, wherein each of the via holes is cut into two halves as a result of said cutting.

2. The method as claimed in claim 1, further comprising:
coating a photoresist on the active surface of the chip and the bonding pads before the step of forming the holes; and
stripping off the photoresist after the step of forming the holes.

3. The method as claimed in claim 1, further comprising:
grinding the back surface of the wafer so as to reduce the thickness of the wafer to a predetermined thickness and expose the via holes out of the ground back surface.

4. The method as claimed in claim 1, further comprising:
forming a plurality of compliant pads on the back surface of the chip, corresponding to the solder pads, respectively.

5. The method as claimed in claim 1, further comprising:
coating a solder mask on the back surface of the chip with the solder pads of the metal traces exposed therefrom.

6. The method as claimed in claim 1, further comprising:
forming an insulating layer on the inner surface of each the hole.

7. The method as claimed in claim 1, further comprising:
disposing a plurality of solder balls on the solder pads of the metal traces, respectively.

8. The method as claimed in claim 1, wherein the lid is made of transparent material.

9. The method as claimed in claim 8, wherein the transparent material is selected from a group consisting of glass, acrylic resin and sapphire.

10. The method as claimed in claim 1, wherein the optical component is formed from complementary metal-oxide semiconductor (CMOS).

11. The method as claimed in claim 1, wherein each of the metal traces extends across one of the scribe lines between an adjacent pair of the chips, and wherein each of the metal traces is cut into two halves as a result of said cutting.

12. The method as claimed in claim 1, further comprising:
forming a plurality of pad extension traces on the active surface of the wafer before the step of forming the holes, wherein each of the pad extension traces extends across one of the scribe lines between an adjacent pair of the chips, and electrically connects one of the bonding pads in one of the adjacent chips to one of the bonding pads in the other chip, and wherein the holes are formed through the pad extension traces, respectively.

* * * * *